(12) United States Patent
Hsieh et al.

(10) Patent No.: US 11,527,406 B2
(45) Date of Patent: Dec. 13, 2022

(54) TRENCH ETCHING PROCESS FOR PHOTORESIST LINE ROUGHNESS IMPROVEMENT

(71) Applicants: TAIWAN SEMICONDUCTOR MANUFACTURING COMPANY, LTD., Hsinchu (TW); TSMC NANJING COMPANY, LIMITED, Nanjing (CN)

(72) Inventors: Sheng-Lin Hsieh, Hsinchu (TW); I-Chih Chen, Tainan (TW); Ching-Pei Hsieh, Kaohsiung (TW); Kuan Jung Chen, Hsinchu (TW)

(73) Assignees: TAIWAN SEMICONDUCTOR MANUFACTURING COMPANY, LTD., Hsinchu (TW); TSMC NANJING COMPANY, LIMITED, Nanjing (CN)

( * ) Notice: Subject to any disclaimer, the term of this patent is extended or adjusted under 35 U.S.C. 154(b) by 88 days.

(21) Appl. No.: 16/742,433

(22) Filed: Jan. 14, 2020

(65) Prior Publication Data

US 2021/0183644 A1 Jun. 17, 2021

(30) Foreign Application Priority Data

Dec. 11, 2019 (CN) .......................... 201911270313.8

(51) Int. Cl.
*H01L 21/027* (2006.01)
*H01L 21/033* (2006.01)
*H01L 21/768* (2006.01)

(52) U.S. Cl.
CPC ...... *H01L 21/0276* (2013.01); *H01L 21/0332* (2013.01); *H01L 21/0337* (2013.01); *H01L 21/76816* (2013.01); *H01L 21/76819* (2013.01)

(58) Field of Classification Search
None
See application file for complete search history.

(56) References Cited

U.S. PATENT DOCUMENTS

2007/0287298 A1* 12/2007 Ishibashi ........... H01L 21/31144
438/725
2011/0117749 A1* 5/2011 Sheu ................. H01J 37/32935
438/735

(Continued)

FOREIGN PATENT DOCUMENTS

TW 200719079 5/2007
TW 201705364 2/2017

OTHER PUBLICATIONS

Office Action dated Mar. 24, 2021 for corresponding case No. TW 11020267900. (pp. 1-5).

*Primary Examiner* — Alexander G Ghyka
(74) *Attorney, Agent, or Firm* — Hauptman Ham, LLP

(57) ABSTRACT

A method of forming a semiconductor device structure is provided. The method includes forming a resist structure over a substrate. The resist structure includes an anti-reflective coating (ARC) layer and a photoresist layer over the ARC layer. The method further includes patterning the photoresist layer to form a trench therein. The method further includes performing a hydrogen plasma treatment to the patterned photoresist layer. The hydrogen plasma treatment is configured to smooth sidewalls of the trench without etching the ARC layer. The method further includes patterning the ARC layer using the patterned photoresist layer as a etch mask.

12 Claims, 9 Drawing Sheets

(56) References Cited

U.S. PATENT DOCUMENTS

| | | | |
|---|---|---|---|
| 2011/0306215 A1* | 12/2011 | Ding | H01L 21/32137 438/720 |
| 2013/0251972 A1* | 9/2013 | Toida | C09J 7/25 428/220 |
| 2013/0267097 A1* | 10/2013 | Srivastava | H01J 37/32082 438/710 |
| 2015/0332934 A1* | 11/2015 | Yu | H01L 29/7851 257/288 |

\* cited by examiner

TRENCH ETCHING PROCESS FOR PHOTORESIST LINE ROUGHNESS IMPROVEMENT

PRIORITY CLAIM

The present application claims priority to the China Patent Application No. 201911270313.8, filed Dec. 11, 2019, which is incorporated herein by reference in its entirety.

BACKGROUND

Integrated circuits contain numerous devices such as transistors, diodes, capacitors and resistors that are fabricated on and/or in a semiconductor substrate. These devices are initially isolated from one another and are later interconnected together to form functional circuits in the back end of line (BEOL) processing stage. As features in integrated circuits continue to shrink, the impact of the interconnect structures on the performance and reliability of the integrated circuits increases.

BRIEF DESCRIPTION OF THE DRAWINGS

The present disclosure is best understood from the following detailed description when read in conjunction with the accompanying drawings. It is emphasized that, according to common practice, the various features of the drawings are not necessarily to scale. On the contrary, the dimensions and spatial relationship(s) of the various features may be arbitrarily enlarged or reduced for clarity. Like reference numerals denote like features throughout specification and drawings.

DETAILED DESCRIPTION

Figure 1:
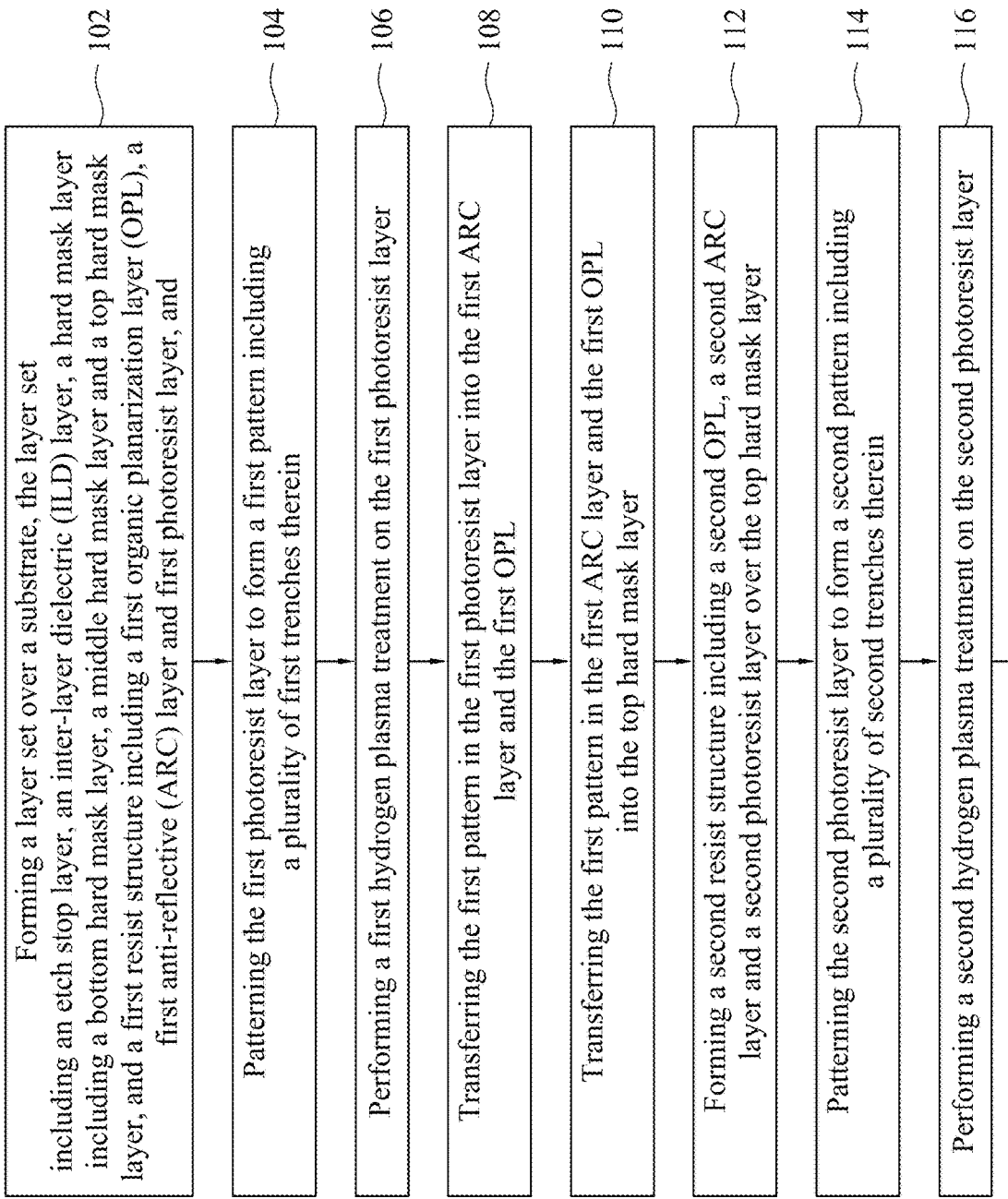
FIG. 1 is a flow chart of a method of fabricating a semiconductor device structure, in accordance with one or more embodiments.
Figure 1:
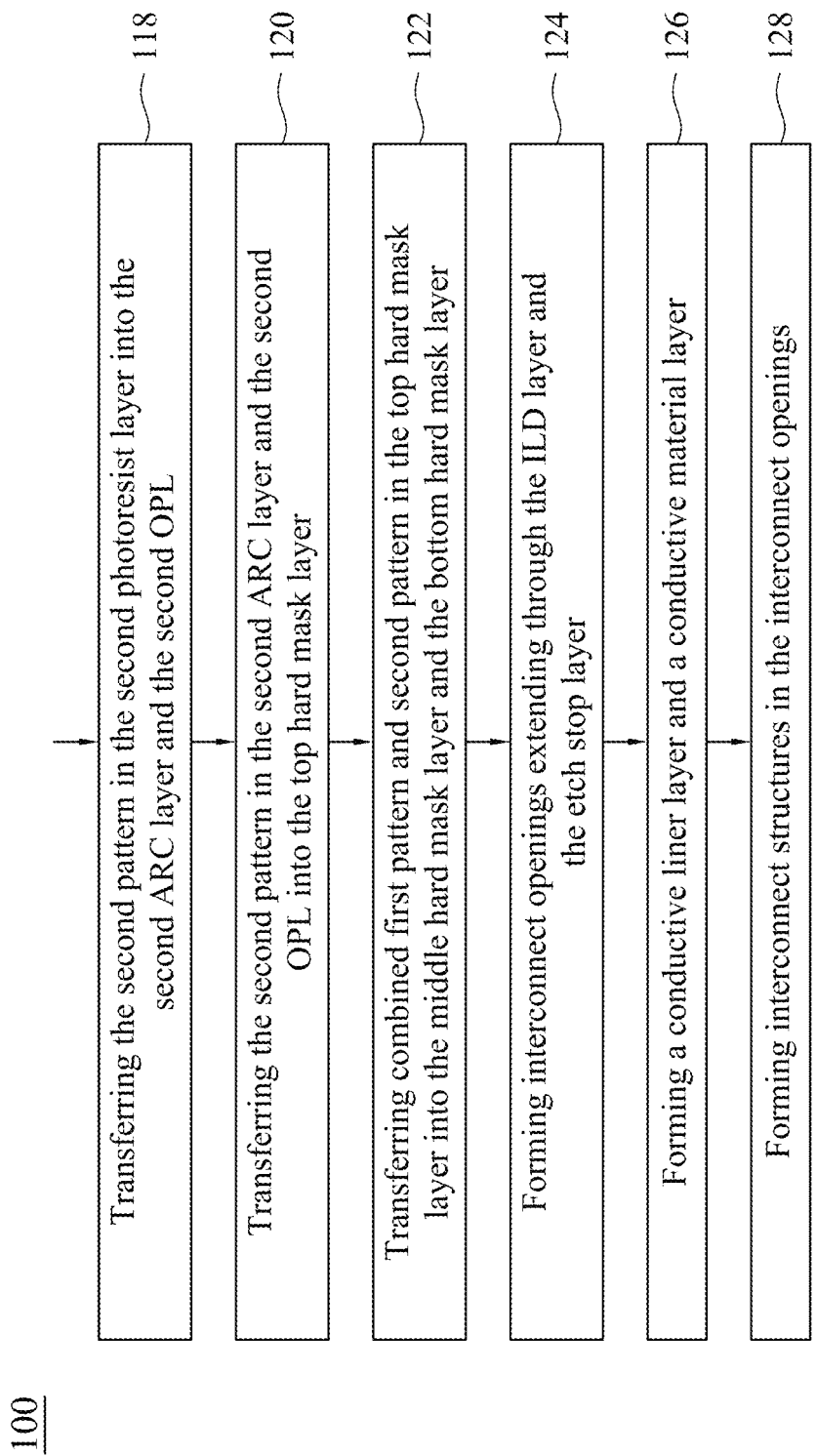

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In manufacturing of integrated circuits, techniques such as lithographic patterning and etching are used to form interconnect structures on a semiconductor substrate. In a lithography process, a photoresist film is first deposited. The photoresist film is then exposed to a radiation and developed in a developer (a chemical solution). The developer removes portions of the photoresist film, thereby forming a resist pattern which include line patterns and/or trench patterns. The resist pattern is used as an etch mask in subsequent etching processes, transferring the pattern to underlying layers. The morphology of the resist pattern, such as resist sidewall angle and sidewall roughness, directly impacts quality of features formed in integrated circuits.

The lines and/or trenches of a resist pattern are often formed with randomly winding edges. The edge irregularity is defined by line edge roughness (LER). Two edges of a line pattern with LER cause a line width variation called line width roughness (LWR). Large LWR is disadvantageous as the etching process duplicates the roughness of the resist pattern when transferring the resist pattern into the underlying layers. As features sizes of integrated circuits continue to scale down in advanced technology node, large LWR reduces metal line bridge window. Adjacent interconnect structures with large LWR are susceptible to electrical shorts, which leads to device degradation or failure.

The present disclosure provides methods to reduce LWR of a photoresist layer disposed on a substrate; and the resulting semiconductor device. The LWR of the photoresist layer is reduced by performing a hydrogen plasma treatment on the photoresist layer after resist exposure and development processes. The hydrogen radicals in the hydrogen plasma saturate dangling bonds created during the photoresist patterning process, and reduces the line width roughness of the resist pattern. The improved resist roughness increases a bridge margin of metal lines, which leads to an increase in the device reliability.

FIG. 1 is a flow chart of a method 100 of forming a semiconductor device structure, in accordance with one or more embodiments. FIG. 2 through 15 are cross-sectional views of an exemplary semiconductor device structure 200 during various fabrication stages and made by the method 100. With reference to FIGS. 1 through 15, the method 100 and the exemplary semiconductor device structure 200 are collectively described below. In some embodiments, additional operations are performed before, during, and/or after the method 100, or some of the operations described are replaced and/or eliminated. In some embodiments, additional features are added to the semiconductor device structure 200. In some embodiments, some of the features described in the semiconductor device structure 200 are replaced or eliminated. One of ordinary skill in the art would understand that although some embodiments are discussed with operations performed in a particular order, these operations may be performed in another logical order.

Figure 2:
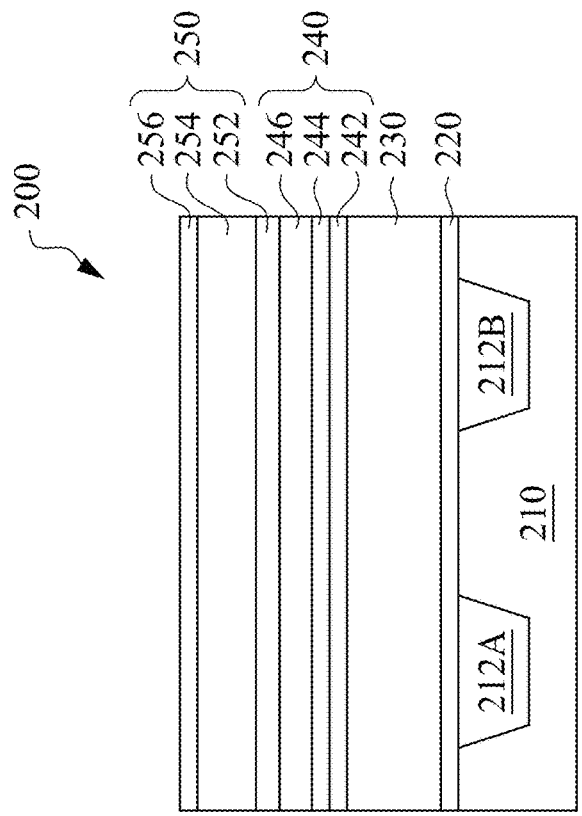

Referring to FIGS. 1 and 2, the method 100 includes operation 102 in which a layer set is formed over a substrate 210, in accordance with one or more embodiments. In some embodiments, the layer set includes an etch stop layer 220, an inter-layer dielectric (ILD) layer 230, a hard mask layer 240, and a first resist structure 250.

In some embodiments, the substrate 210 includes a semiconductor substrate (not separately shown) containing semiconductor devices such as field effect transistors therein and at least one dielectric layer (not separately shown) over the semiconductor substrate. The at least one dielectric layer embeds a plurality of conductive structures, e.g., a first conductive structure 212A and a second conductive structure 212B. In some embodiments, the plurality conductive structures (212A, 212B) comprises gate and source/drain contacts electrically connected to various components in the semiconductor devices. In other embodiments, the plurality of conductive structures (212A, 212B) comprises interconnect structures to provide electrical connections to various types of semiconductor devices in the semiconductor substrate. In some embodiments, each conductive structure (212A, 212B) is a metal line that provides lateral electrical connections, a metal via that provides vertical electrical connections, or a combination of at least one metal line and at least one metal via.

In some embodiments, the semiconductor substrate is a bulk semiconductor substrate including silicon. Alternatively or additionally, in some embodiments the bulk semiconductor substrate includes another elementary semiconductor such as germanium, a compound semiconductor such as gallium arsenide, gallium phosphide, indium phosphide, indium arsenide, and/or indium antimonide, an alloy semiconductor such as SiGe, GaAsP, AlInAs, AlGaAs, GaInAs, GaInP, and/or GaInAsP; or combinations thereof. In some embodiments, the semiconductor substrate includes an epitaxial layer overlying a bulk semiconductor substrate. Furthermore, in some embodiments, the semiconductor substrate is a semiconductor on insulator (SOI) substrate including a buried oxide (BOX) layer.

The at least one dielectric layer electrical insulates the plurality of conductive structures (212A, 212B) from one another. In some embodiments, the at least one dielectric layer includes silicon oxide. In some embodiments, the at least one dielectric layer includes a low-k dielectric material having a dielectric constant (k) less than 4. In some embodiments, the dielectric layer has a k value less than 3.5. In some embodiments, the at least one dielectric layer has a k value less than 2.5. Suitable low-k dielectric materials include, but are not limited to, tetraethylorthosilicate (TEOS) oxide, undoped silicate glass, or doped silicate glass such as borophosphosilicate glass (BPSG), fluorosilica glass (FSG), phosphosilicate glass (PSG), boron doped silicon glass (BSG), polyimide, and porous dielectric materials.

The conductive structures 212A, 212B are embedded in the dielectric layer. In some embodiments, the conductive structures 212A, 212B are made of conductive metals such as, for example, copper (Cu), aluminum (Al), tungsten (W), cobalt (Co), or an alloy thereof.

The etch stop layer 220 is formed over the substrate 210. The etch stop layer 220 may be a single layer or multiple layers. The etch stop layer 220 protects the underlying substrate 210 from being damaged by a subsequent etching process performed to etch the ILD layer 230. Additionally, in some embodiments, the etch stop layer 220 also prevents diffusion of metal impurities, moisture, or other gaseous impurities into the substrate 210. In some embodiments, the etch stop layer 220 comprises silicon nitride (SiN), silicon oxynitride (SiON), silicon carbide (SiC), silicon carbon nitride (SiCN), boron nitride (BN), silicon boron nitride (SiBN), silicon carbon boron nitride (SiCBN), combinations thereof, or other suitable materials. In some embodiments, the etch stop layer 220 is formed by CVD, PECVD, atomic layer deposition (ALD), or other suitable processes. The etch stop layer 220 has a thickness suitable to function as a stop layer to protect the underlying substrate 210 from damage and the thickness varies according to the process node in which the semiconductor device structure 200 is being manufactured.

The ILD layer 230 is formed over the etch stop layer 220. In some embodiments, the etch stop layer 220 is omitted and the ILD layer 230 is directly over the substrate 210. In some embodiments, the ILD layer 230 includes silicon oxide. In some embodiments, the ILD layer 230 includes a low-k dielectric material having a dielectric constant (k) less than 4. In some embodiments, the ILD layer 230 has a k value less than 3.5. In some embodiments, the ILD layer 230 has a k value less than 2.5. Suitable low-k dielectric materials include, but are not limited to, silicon oxide formed using tetraethylorthosilicate (TEOS) oxide, undoped silicate glass, or doped silicate glass such as borophosphosilicate glass (BPSG), fluorosilica glass (FSG), phosphosilicate glass (PSG), boron doped silicon glass (BSG), and porous dielectric materials. In some embodiments, the ILD layer 230 is formed by chemical vapor deposition (CVD), plasma enhanced chemical vapor deposition (PECVD), spin coating, or other suitable deposition processes.

The hard mask layer 240 is formed over the ILD layer 230. The hard mask layer 240 is configured to provide a high etching selectivity relative to ILD layer 230 during the subsequent etching processing. In some embodiments, the hard mask layer 240 has a single layer structure comprising silicon oxide, silicon nitride, or silicon oxynitride. In some embodiments, the hard mask layer 240 has a multilayer structure. In some embodiments, the hard mask layer 240 has a tri-layer structure including a bottom hard mask layer 242, a middle hard mask layer 244 over the bottom hard mask layer 242, and a top hard mask layer 246 over the middle hard mask layer 244.

In some embodiments, the bottom hard mask layer 242 includes a dielectric oxide material such as, for example, silicon oxide, or a high-k dielectric oxide having a dielectric constant greater than 4.0. Exemplary high-k dielectric oxides include, but are not limited to, aluminum oxide ($Al_2O_3$), hafnium oxide ($HfO_2$), titanium oxide ($TiO_2$), and zirconium oxide ($ZrO_2$). In some embodiments, the bottom hard mask layer 242 is formed by CVD, PECVD, ALD, or other suitable deposition processes. In some embodiments, the bottom hard mask layer 242 includes silicon oxide deposited by CVD or PECVD process that employs tetraethylorthosilicate (TEOS) and oxygen as precursors.

In some embodiments, the middle hard mask layer 244 includes a dielectric nitride such as, for example, silicon nitride. In some embodiments, the middle hard mask layer 244 includes a metal nitride such as, for example, titanium nitride (TiN), tantalum nitride (TaN), or tungsten nitride (WN). In some embodiments, the middle hard mask layer 244 is formed by CVD, PEDVD, ALD, or other suitable deposition processes.

In some embodiments, the top hard mask layer 246 includes a dielectric oxide or a high-k dielectric oxide described above for the bottom hard mask layer 242. For example, in some embodiments, the top hard mask layer 246 includes silicon oxide, $Al_2O_3$, $HfO_2$, $ZrO_2$, or other suitable high-k dielectric oxide. In some embodiments, the top hard mask layer 246 includes a dielectric material the same as the material of the bottom hard mask layer 242. In some embodiments, the top hard mask layer 246 includes a dielectric material different from the material of the bottom hard mask layer 242. In some embodiments, the top hard mask layer 246 is formed by CVD, PECVD, ALD, or other suitable deposition processes.

The first resist structure 250 is formed over the hard mask layer 240. In some embodiments, the first resist structure 250 has a tri-layer structure including a first organic planarization (OPL) 252, a first anti-reflective coating (ARC) layer 254 over the first OPL 252, and a first photoresist layer 256 over the first ARC layer 254. In some embodiments, the first OPL 252 or both of the first OPL 252 and the first ARC layer 254 are omitted.

The first OPL 252 includes an organic self-planarizing material that is capable of providing a planarized surface upon which the first ARC layer 254 is formed. In some embodiments, the first OPL 252 includes spin-on carbon, diamond-like carbon, polyarylene ether, polyimide, or other suitable organic planarization materials. In some embodiments, the first OPL 252 is formed by CVD, spin coating, or other suitable deposition processes. The first OPL 252 is formed to have a thickness sufficient to provide a planarized surface. In some embodiments, the thickness of the first OPL 252 is from about 50 nm to about 300 nm. If the thickness of the first OPL 252 is too small, the first OPL 252 is not able to provide a planarized surface, in some embodiments. If the thickness of the first OPL 252 is too great, production costs are increased as a result of unnecessary consumption of material and increased processing time to pattern the first OPL 252, in some embodiments.

The first ARC layer 254 is formed on the first OPL 252. The first ARC layer 254 reduces reflection of light from underling layers during photolithography, thus increasing the precision of pattern formed in the first photoresist layer 256. In some embodiments, the first ARC layer 254 includes a nitrogen-free ARC (NFARC) material such as, for example, silicon oxide or carbon-doped silicon oxide. In some embodiments, the first ARC layer 254 is formed using CVD, PVD, ALD, spin coating, or other suitable deposition processes. The first ARC layer 254 is formed to have a thickness to provide sufficient anti-reflective qualities based upon the materials and the wavelengths. In some embodiments, the thickness of the first ARC layer 254 is from about 20 nm to about 100 nm. If the thickness of the first ARC layer 254 is too small, the first ARC layer 254 is not able to sufficiently reduce the light reflection, and as a result the precision of pattern formed in the first photoresist layer 256 is compromised, in some embodiments. If the thickness of the first ARC layer 254 is too great, production costs are increased as a result of unnecessary consumption of material and increased processing time to etch the first ARC layer 254, in some embodiments.

The first photoresist layer 256 is formed on the first ARC layer 254. The first photoresist layer 256 is used to define a first pattern to be transferred to the ILD layer 230 through the first ARC layer 254, the first OPL 252 and the hard mask layer 240. The first photoresist layer 256 comprises either a positive photoresist material or a negative photoresist material. In some embodiments, the first photoresist layer 256 includes an extreme ultraviolet (EUV) photoresist material. In some embodiments, the first photoresist layer 256 includes a deep ultraviolet (DUV) photoresist material. In some embodiments, the first photoresist layer 256 comprises an organic or inorganic polymer having a molecular weight ranging from 2,000 to 20,000. In some embodiments, the first photoresist layer 256 is deposited by spin coating or other suitable deposition processes. In some embodiments, the first photoresist layer 256 has a thickness ranging from about 35 nm to about 50 nm. The thickness of the first photoresist layer 256 is greater than the thickness of the first ARC layer 254. For example, if the thickness of the first photoresist layer 256 is too small, the first photoresist layer 256 will be removed during patterning of the first ARC layer 254, which results in inaccurate transfer of the pattern of first photoresist layer 256 to the ILD layer 230, in some embodiments. If the thickness of the first photoresist layer 256 too great, production costs are increased as a result of unnecessary consumption of material and increased processing time to pattern the first photoresist layer 256, in some embodiments.

Figure 3:
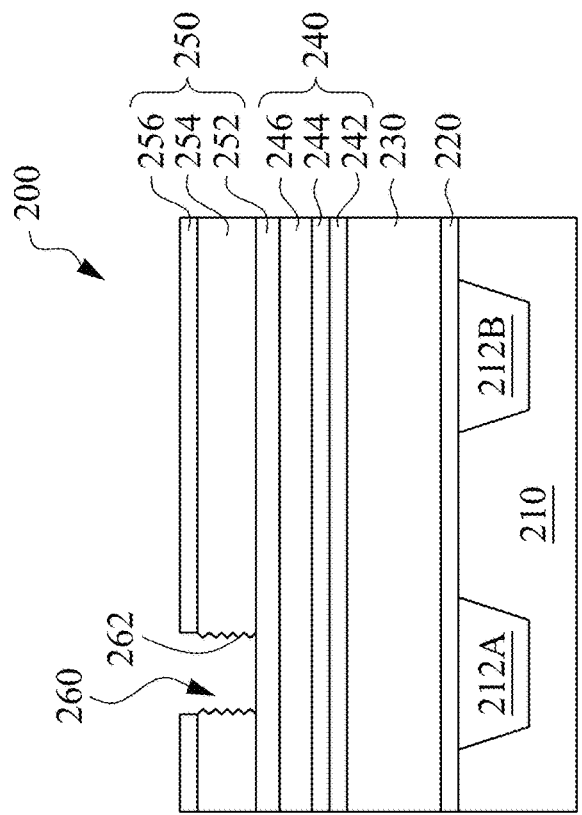
FIGS. 2-15 are cross-sectional views of a semiconductor device structure during various stages of manufacture, in accordance with one or more embodiments.

Referring to FIGS. 1 and 3, method 100 proceeds to operation 104 in which the first photoresist layer 256 is lithographically patterned to form the first pattern including a plurality of first trenches 260 therein, in accordance with one or more embodiments. For simplicity, a single first trench 260 is shown in FIG. 3. In some embodiments, the first pattern corresponds to a pattern for metal lines to be transferred to the ILD layer 230 during subsequent processing. The first trench 260 exposes a portion of the first ARC layer 254 beneath the first photoresist layer 256 that is substantially aligned to one of the plurality of conductive structure, e.g., first conductive structure 212A.

In some embodiments, the lithography process for patterning the first photoresist layer 256 includes exposing the first photoresist layer 256 to a pattern of radiation and developing exposed or unexposed portions of the first photoresist layer 256 depending on whether a positive or negative resist is used in the first photoresist layer 256 with a resist developer. In some embodiments, the lithography process is a DUV lithography process which involves radiation at a wavelength ranging from 193 nm to 248 nm. In some embodiments, the lithography process is an EUV lithography process which involves radiation at a wavelength of approximately 13.5 nm. The short wavelength of the EUV radiation enables a denser patterning of the first photoresist layer 256 in comparison with radiation having longer wavelengths. The increased pattern density reduces the critical dimensions of the semiconductor devices and facilitates technology node shrinkage.

However, various factors in the lithography process such as light intensity variation in the exposure process and/or chemical solution used for in the resist develop process cause poor critical dimension control in the first photoresist layer 256, thereby resulting LWR along sidewalls 262 of the first trench 260. The LWR problem becomes more severe as lithography moves to shorter wavelengths. A large LWR results in inaccurate feature transfer to the underlying layers, increasing the risk of electrical shorts between neighboring metal lines, and eventually device degradation or failure and yield loss.

Figure 4:
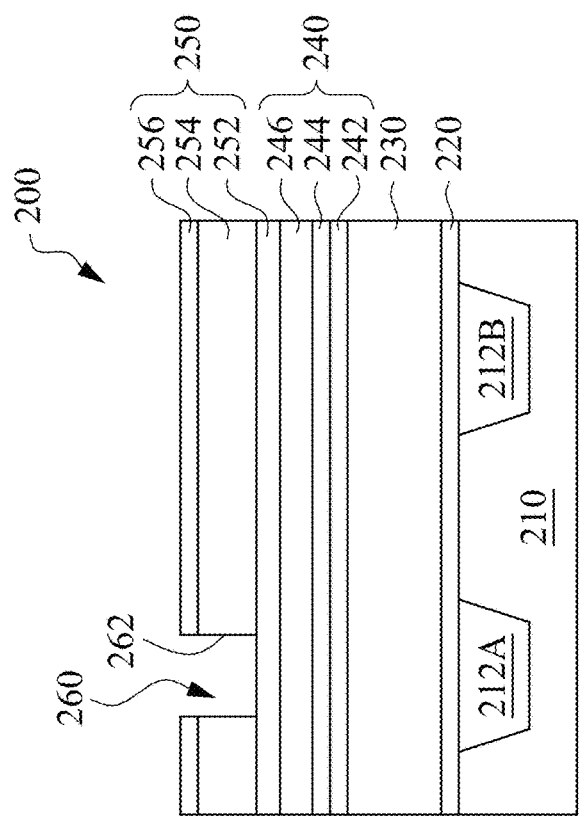
Figure 15:
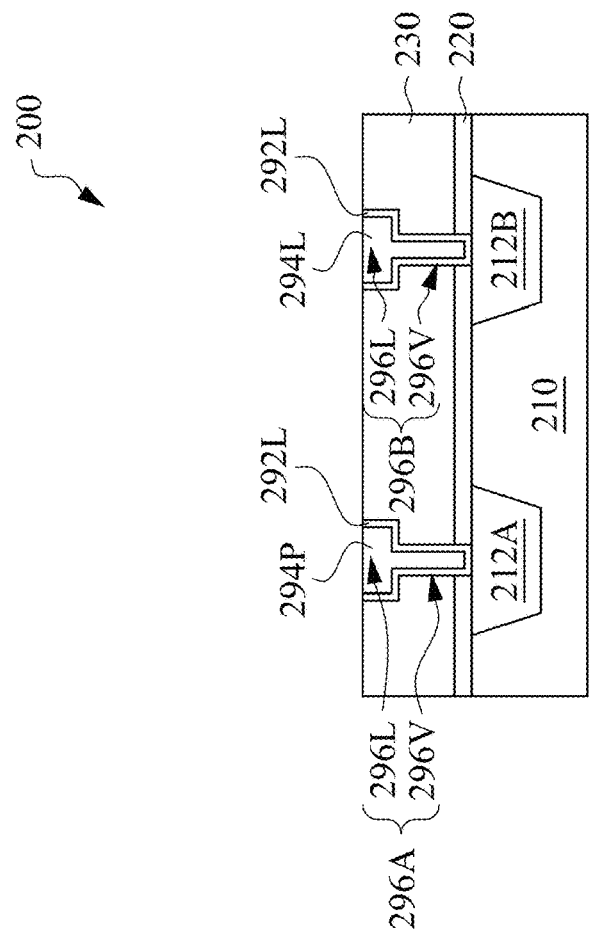

Referring to FIGS. 1 and 4, the method 100 proceeds to operation 106 in which a first hydrogen plasma treatment is performed on the first photoresist layer 256. Positively charged hydrogen atoms (W) in the hydrogen plasma saturate dangling bonds on sidewall surfaces of the first trench 260, thereby smoothing sidewalls 262 of the first trench 260. As a result, the LER of trench pattern in the first photoresist layer 256 is reduced. In some embodiments, the hydrogen plasma treatment results in approximately 7.5 nanometers (nm) to 7.3 nm decrease in the LER of trench pattern formed in the first photoresist layer 256. In some embodiments, the LER of trench pattern in the first photoresist layer 256 is reduced about 43% after the hydrogen plasma treatment. In some embodiments, the LER of trench pattern in the first photoresist layer 256 prior to the hydrogen plasm treatment is from 7 nm to 8 nm, and after the hydrogen plasma treatment, the LER of trench pattern in the first photoresist layer 256 is reduced to be from 3.8 nm to 4.8 nm. Too great LER and the resulting large LWR increase the risk of electrical shorts between adjacent metal lines 296L in the semiconductor device structure 200 (FIG. 15).

In some embodiments, the hydrogen plasma is generated by igniting or ionizing a process gas containing hydrogen. In some embodiments, the process gas contains a hydrogen gas and a carrier gas. In some embodiments, the carrier gas includes an inert gas such as nitrogen, argon, helium, or mixture thereof. The flow rate of the hydrogen gas is controlled such that no etching to the first ARC layer 254 occurs during the hydrogen plasma treatment. In some embodiments, a flow rate of the hydrogen gas is from about 20 standard cubic centimeters per minute (sccm) to about 500 sccm, and a flow rate of the nitrogen gas is from about 10 sccm to about 300 sccm. In some embodiments, the process gas further includes a fluorine-containing gas such as, for example, fluoromethane ($CH_3F$), difluoromethane ($CH_2F_2$), or trifluoromethane ($CHF_3$). In some embodiments, a flow rate of the fluorine-containing gas is from about 0 sccm to about 100 sccm. In some embodiments, the hydrogen plasma treatment is conducted at a temperature ranging from about 200° C. to about 600° C. In some embodiments, the hydrogen plasma treatment is conducted under a pressure ranging from about 5 millitorr (mT) to about 20 mT. In some embodiments, the hydrogen plasma treatment is conducted by a power ranging from about 400 watts (W) to about 1000 W.

The hydrogen plasma treatment thus helps to reduce LWR of patterned features in the first photoresist layer 256. The improved resist LWR helps to provide better critical dimension control over the patterning of the underlying layers during subsequent pattern transfer processes.

Figure 5:
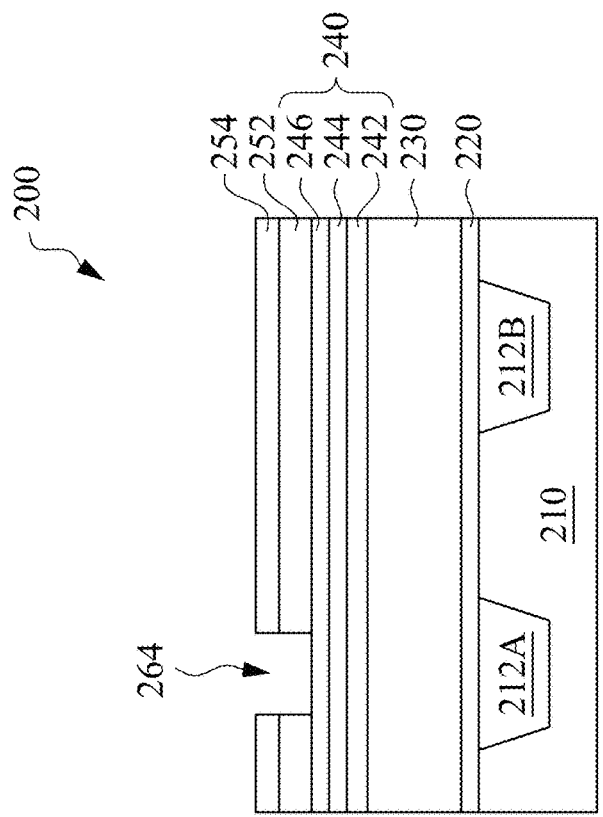

Referring to FIGS. 1 and 5, the method 100 proceeds to operation 108 in which the first pattern in the first photoresist layer 256 is transferred into the first ARC layer 254 and the first OPL 252 by an etching process. The etching process forms a trench 264 extending through the first ARC layer 254 and the first OPL 252, exposing a portion of the top hard mask layer 246. The etching process is either a wet etching or a dry etching process. In some embodiments, different etching processes are used to etch the first ARC layer 254 and the first OPL 252 sequentially. In some embodiments, a single etching process is used to etch the first ARC layer 254 and the first OPL 252. In some embodiments, a dry etching process such as, for example, reactive ion etching (RIE) is performed. In some embodiments, an etchant is used for etching the first ARC layer 254 and the first OPL 252 is $CF_4$. After transferring the first pattern into the first ARC layer 254 and the first OPL 252, the first photoresist layer 256 is removed using a suitable process such as, for example, wet stripping or plasma ashing.

Figure 6:
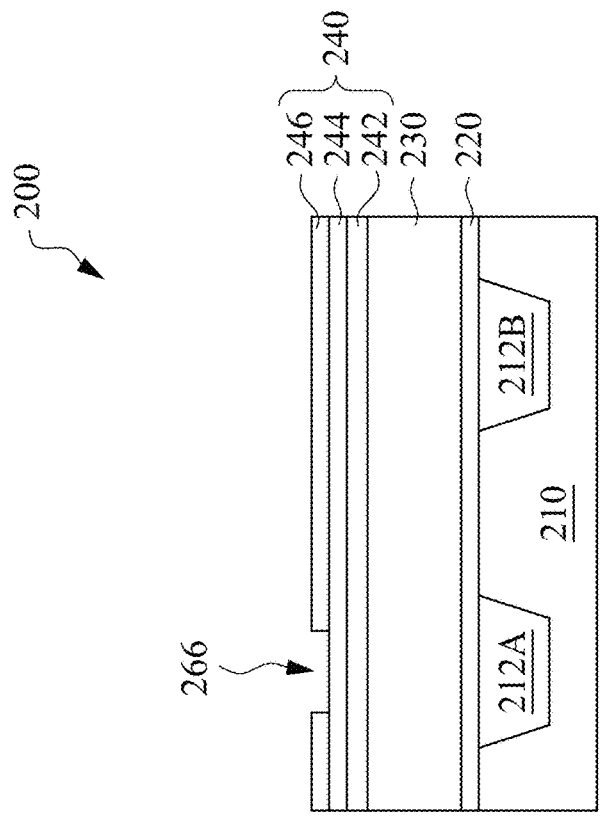

Referring to FIGS. 1 and 6, method 100 proceeds to operation 110 in which the first pattern of the first ARC layer 254 and the first OPL 252 is transferred into the top hard mask layer 246 by an etching process. The etching process forms a trench 266 extending through the top hard mask layer 246, exposing a portion of the middle hard mask layer 244. The etching process is a wet etching or dry etching process. In some embodiments, RIE is performed to remove the material of the top hard mask layer 246 selective to the material of the middle hard mask layer 244.

Figure 7:
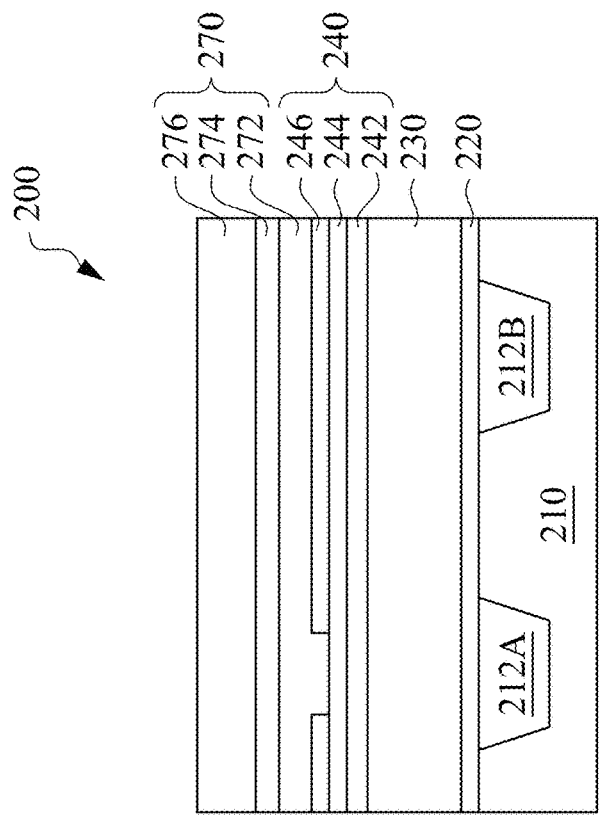

Referring to FIGS. 1 and 7, method 100 proceeds to operation 112 in which a second resist structure 270 is formed over the hard mask layer 240 and in the first trench 266. In some embodiments, the second resist structure 270 has a tri-layer structure including a second OPL 272, a second ARC layer 274 over the second OPL 272, and a second photoresist layer 276 over the second ARC layer 274. In some embodiments, one or both of the second OPL 272 and the second ARC layer 274 are omitted.

The second OPL 272 includes an organic self-planarizing material that is capable of providing a planarized surface upon which the second ARC layer 274 is formed. In some embodiments, the first OPL 252 includes spin-on carbon, diamond-like carbon, polyarylene ether, polyimide, or other suitable organic planarization materials. In some embodiments, the second OPL 272 includes a material the same as the material of the first OPL 252. In some embodiments, the second OPL 272 includes a material different from the material of the first OPL 252. In some embodiments, the second OPL 272 is formed by CVD, spin coating, or other suitable deposition processes. The second OPL 272 is formed to have a thickness sufficient to provide a planarized surface. In some embodiments, the thickness of the second OPL 272 is from about 50 nm to about 300 nm. If the thickness of the second OPL 272 is too small, the second OPL 272 is not able to provide a planarized surface, in some embodiments. If the thickness of the second OPL 272 is too great, production costs are increased as a result of unnecessary consumption of material and increased processing time to pattern the second OPL 272, in some embodiments.

The second ARC layer 274 is formed on the second OPL 272. The second ARC layer 274 reduces reflection of light from underling layers during photolithography, thus increasing the precision of pattern formed in the second photoresist layer 276. In some embodiments, the second ARC layer 274 includes a NFARC material such as, for example, silicon oxide or carbon-doped silicon oxide. In some embodiments, the second ARC layer 274 includes a material the same as the material of the first ARC layer 254. In some embodiments, the second ARC layer 274 includes a material different from the material of the first ARC layer 254. In some embodiments, the second ARC layer 274 is formed using CVD, PVD, ALD, spin coating, or other suitable deposition processes. The second ARC layer 274 is formed to have a thickness to provide sufficient anti-reflective qualities based upon the materials and the wavelengths. In some embodiments, the thickness of the second ARC layer 274 is from about 20 nm to about 100 nm. If the thickness of the second ARC layer 274 is too small, the second ARC layer 274 is not able to sufficiently reduce the light reflection, and as a result the precision of pattern formed in the second photoresist layer 276 is compromised, in some embodiments. If the thickness of the second ARC layer 274 is too great, production costs are increased as a result of unnecessary consumption of material and increased processing time to etch the second ARC layer 274, in some embodiments.

The second photoresist layer 276 is formed on the second ARC layer 274. The second photoresist layer 276 is used to define a second pattern to be transferred to the ILD layer 230 through the second ARC layer 274, the second OPL 272 and the hard mask layer 240. The second photoresist layer 276 comprises either a positive photoresist material or a negative photoresist material. In some embodiments, the second photoresist layer 276 includes an EUV photoresist material. In some embodiments, the second photoresist layer 276 includes a DUV photoresist material. In some embodiments, the second photoresist layer 276 comprises an organic or inorganic polymer having a molecular weight ranging from 2,000 to 20,000. In some embodiments, the second photoresist layer 276 includes a material the same as the material of the first photoresist layer 256. In some embodiments, the second photoresist layer 276 includes a material different from the material of the first photoresist layer 256. In some embodiments, the second photoresist layer 276 is deposited by spin coating or other suitable deposition processes. In some embodiments, the second photoresist layer 276 has a thickness ranging from about 35 nm to about 50 nm. The thickness of the second photoresist layer 276 is greater than the thickness of the second ARC layer 274. For example, if the thickness of the second photoresist layer 276 is too small, the second photoresist layer 276 will be removed during patterning of the second ARC layer 274, which results in inaccurate transfer of the pattern of second photoresist layer 276 to the ILD layer 230, in some embodiments. If the thickness of the second photoresist layer 276 too great, production costs are increased as a result of unnecessary consumption of material and increased processing time to pattern the second photoresist layer 276, in some embodiments.

Figure 8:
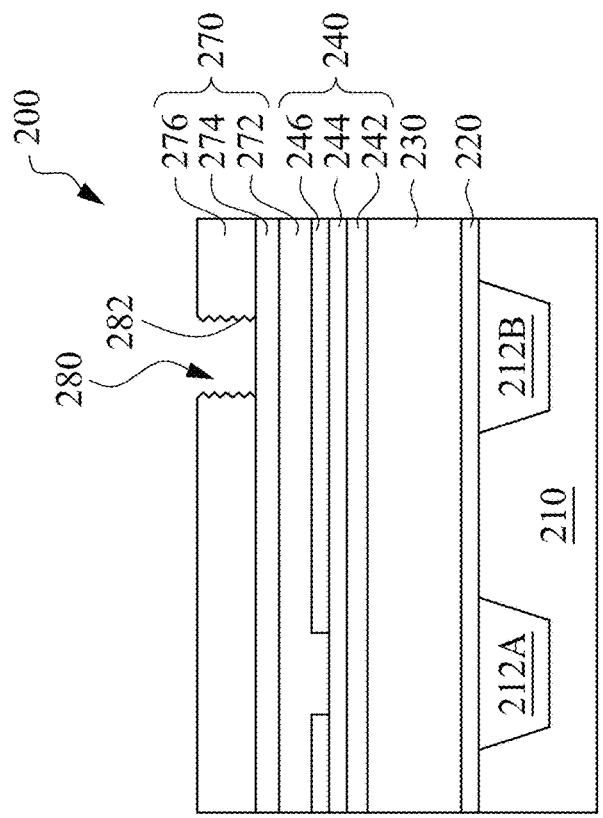

Referring to FIGS. 1 and 8, the method 100 proceeds to operation 114 in which the second photoresist layer 276 is lithographically patterned to form the second pattern including a plurality of second trenches 280 therein, in accordance with one or more embodiments. For simplicity, a single second trench 280 is shown. In some embodiments, the second pattern corresponds to another pattern for metal lines to be transferred to the ILD layer 230 during subsequent processing. The second pattern in the second photoresist layer 276 is configured to form a double patterning structure with the first pattern in the first photoresist layer 256. In some embodiments, the second pattern is formed such that one of second trenches 280 is interposed between two adjacent first trenches 260 (FIG. 3) of the first pattern (not shown). The second pattern thus combines with the first pattern to form a final pattern that has a pitch less than a pitch allowed by a single lithography process. The pitch corresponds to the distance between adjacent trenches in the final pattern. The second trench 280 exposes a portion of the second ARC layer 274 beneath the second photoresist layer 276 that is substantially aligned to one of the plurality of conductive structures, e.g., second conductive structure 212B that is adjacent to the first conductive structure 212A.

In some embodiments, the lithography process for patterning the second photoresist layer 276 is substantially similar to the lithography process for patterning the first photoresist layer 256. For example, the second photoresist layer 276 is exposed to a pattern of radiation and the exposed or unexposed portions of the second photoresist layer 276 are developed depending on whether a positive or negative resist is used in the second photoresist layer 276 with a resist developer. Similar to the first trench 260 described above in FIG. 3, the lithography process for patterning the second photoresist layer 276 also results in LWR along sidewalls 282 of the second trench 280.

Figure 9:
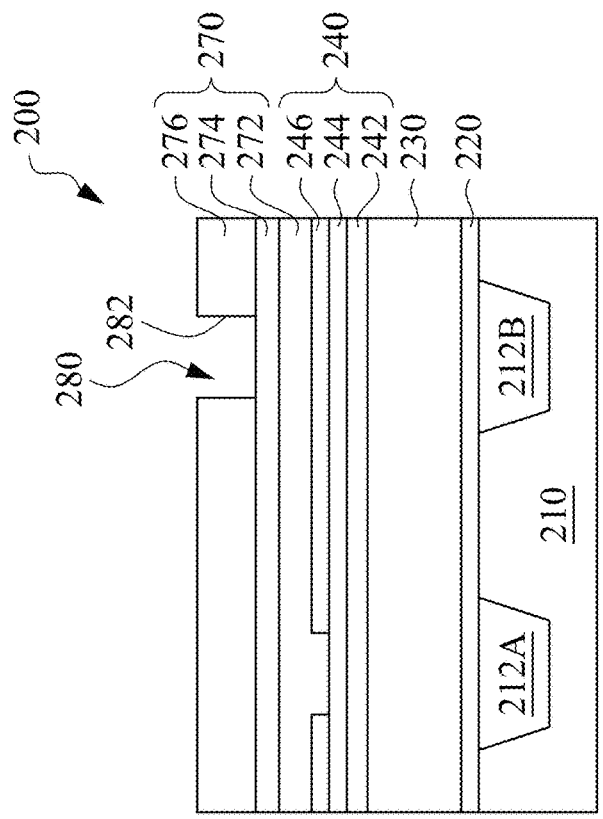

Referring to FIGS. 1 and 9, method 100 proceeds to operation 116 in which a second hydrogen plasma treatment is performed on the second photoresist layer 276. A substantially similar processing as described above in operation 104 in terms of process gas composition for generating hydrogen plasma and hydrogen plasma treatment conditions is performed to smooth sidewalls 282 of the second trench 280 in the second photoresist layer 276. In some embodiments, the hydrogen plasma treatment results in approximately 7.5 nm to 4.3 nm decrease in the LER of trench pattern formed in the second photoresist layer 276. In some embodiments, the LER of trench pattern in the second photoresist layer 276 is reduced about 43% after the hydrogen plasma treatment. In some embodiments, the LER of trench pattern in the second photoresist layer 276 prior to the hydrogen plasm treatment is from 7 nm to 8 nm, and after the hydrogen plasma treatment, the LER of trench pattern in the second photoresist layer 276 is reduced to be from 3.8 nm to 4.8 nm. Too great LER and the resulting large LWR in the second photoresist layer 276 increase the risk of electrical shorts between adjacent metal lines 296L in the semiconductor device structure 200 (FIG. 15).

In some embodiments, conditions of the second plasma treatment is substantially the same as the conditions of the first plasma treatment utilized in reducing LWR of trench pattern in the first photoresist layer 256. In some embodiments, at least one parameter of the second plasma treatment in terms of gas composition, flow rate, processing temperature, processing pressure and power is different from the first plasma treatment utilized in reducing LWR of trench pattern in the first photoresist layer 256. In some embodiments, the process gas utilized in the second plasma treatment contains a hydrogen gas and a carrier gas. In some embodiments, the carrier gas includes an inert gas such as nitrogen, argon, helium, or mixture thereof. The flow rate of the hydrogen gas is controlled such that no etching to the first ARC layer 254 occurs during the hydrogen plasma treatment. In some embodiments, a flow rate of the hydrogen gas is from about 20 standard cubic centimeters per minute (sccm) to about 500 sccm, and a flow rate of the nitrogen gas is from about 10 sccm to about 300 sccm. In some embodiments, the process gas further includes a fluorine-containing gas such as, for example, fluoromethane ($CH_3F$), difluoromethane ($CH_2F_2$), or trifluoromethane ($CHF_3$). In some embodiments, a flow rate of the fluorine-containing gas is from about 0 sccm to about 100 sccm. In some embodiments, the hydrogen plasma treatment is conducted at a temperature ranging from about 200° C. to about 600° C. In some embodiments, the hydrogen plasma treatment is conducted under a pressure ranging from about 5 millitorr (mT) to about 20 mT. In some embodiments, the hydrogen plasma treatment is conducted by a power ranging from about 400 watts (W) to about 1000 W.

The hydrogen plasma treatment thus helps to reduce LWR of patterned features in the second photoresist layer 276. The improved resist LWR helps to provide better critical dimension control over the patterning of the underlying layers during subsequent pattern transfer processes.

Figure 10:
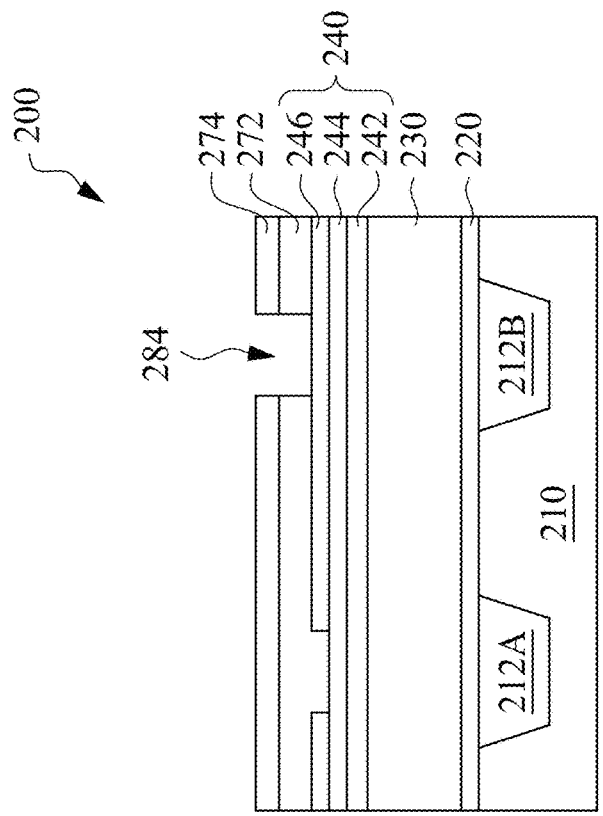

Referring to FIGS. 1 and 10, the method 100 proceeds to operation 118 in which the second pattern in the second photoresist layer 276 is transferred into the second ARC layer 274 and the second OPL 272 by an etching process. The etching process forms a trench 284 extending through the second ARC layer 274 and the second OPL 272, exposing a portion of the top hard mask layer 246. The etching process is either a wet etching or a dry etching process. In some embodiments, different etching processes are used to sequentially etch the second ARC layer 274 and the second OPL 272. In some embodiments, a single etching process is used to etch the second ARC layer 274 and the second OPL 272. In some embodiments, a dry etching process such as, for example, RIE is performed. In some embodiments, an etchant is used for etching the second ARC layer 274 and the second OPL 272 is $CF_4$. After transferring the second pattern into the second ARC layer 274 and the second OPL 272, the second photoresist layer 276 is removed using a suitable process such as, for example, wet stripping or plasma ashing.

Figure 11:
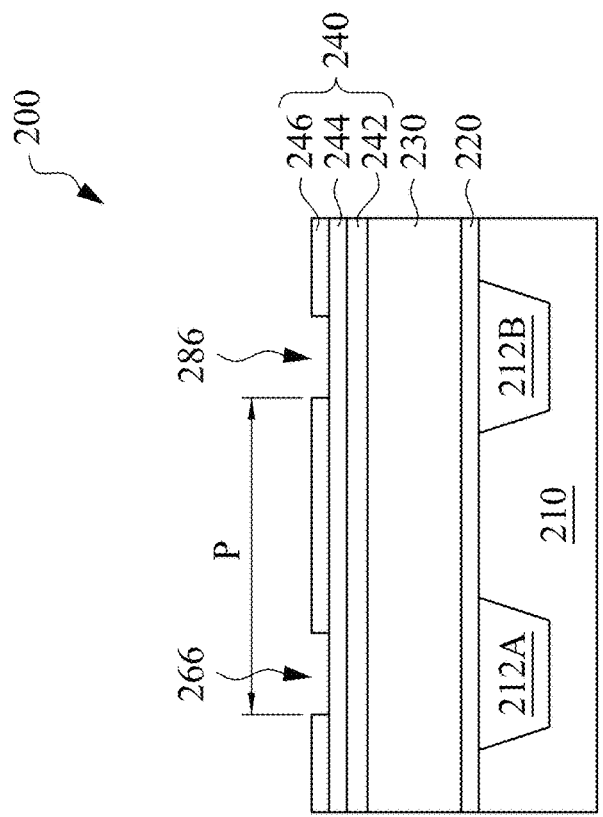

Referring to FIGS. 1 and 11, the method 100 proceeds to operation 120 in which the second pattern of the second ARC layer 274 and the second OPL 272 is transferred into the top hard mask layer 246 by an etching process. The etching process forms a trench 286 extending through the top hard mask layer 246, exposing a portion of the middle hard mask layer 244. The etching process is a wet etching or dry etching process. In some embodiments, RIE is performed to remove the material of the top hard mask layer 246 selective to the material of the middle hard mask layer 244. In some embodiments, an etchant is used for etching the top hard mask layer 246 includes $CF_4$, $CHF_3$, $CH_2F_2$, or combinations thereof. In some embodiments, the pitch (P) between adjacent trenches 266 and 286 is from about 30 nm to about 50 nm. After patterning the top hard mask layer 246, the second ARC layer 274 and the second OPL 272 are removed by, for example, a dry etching process or a wet etching process.

Figure 12:
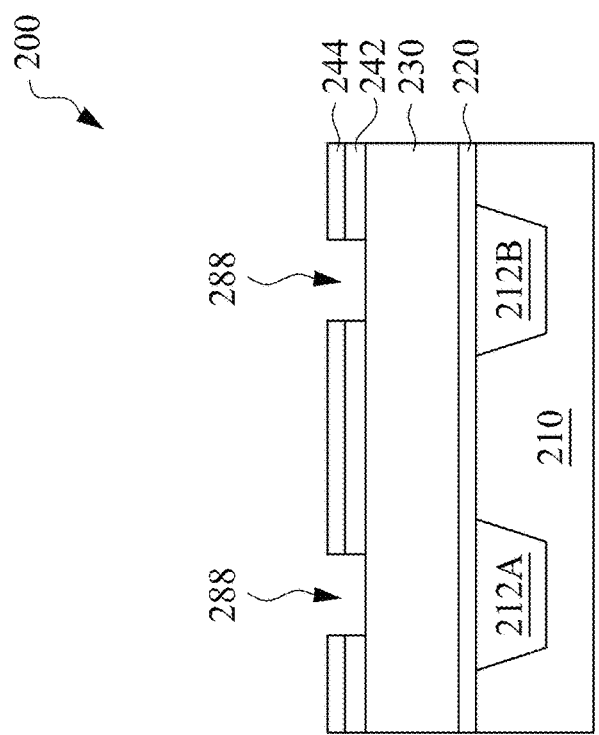

Referring to FIGS. 1 and 12, the method 100 proceeds to operation 122 in which a combined pattern of the first pattern and the second pattern in the top hard mask layer 246 is transferred into the middle hard mask layer 244 and the bottom hard mask layer 242 by an etching process. The etching process forms trenches 288 extending through the middle hard mask layer 244 and the bottom hard mask layer 242, exposing portions of the ILD layer 230 overlying conductive structures 212A and 212B. The etching process is either a wet etching or a dry etching process. In some embodiments, different etching processes are used to sequentially etch the middle hard mask layer 244 and the bottom hard mask layer 242. In some embodiments, a single etching process is used to etch middle hard mask layer 244 and the bottom hard mask layer 242. In some embodiments, a dry etching process such as, for example, RIE is performed. In some embodiments, an etchant is used for etching the middle hard mask layer 244 and the bottom hard mask layer 242 includes $CF_4$, $CHF_3$, $CH_2F_2$, or combinations thereof. After the etching process, the top hard mask layer 246 is removed by a dry etching or a wet etching process that removes the material of the top hard mask layer 246 selective to the middle hard mask layer 244.

Figure 13:
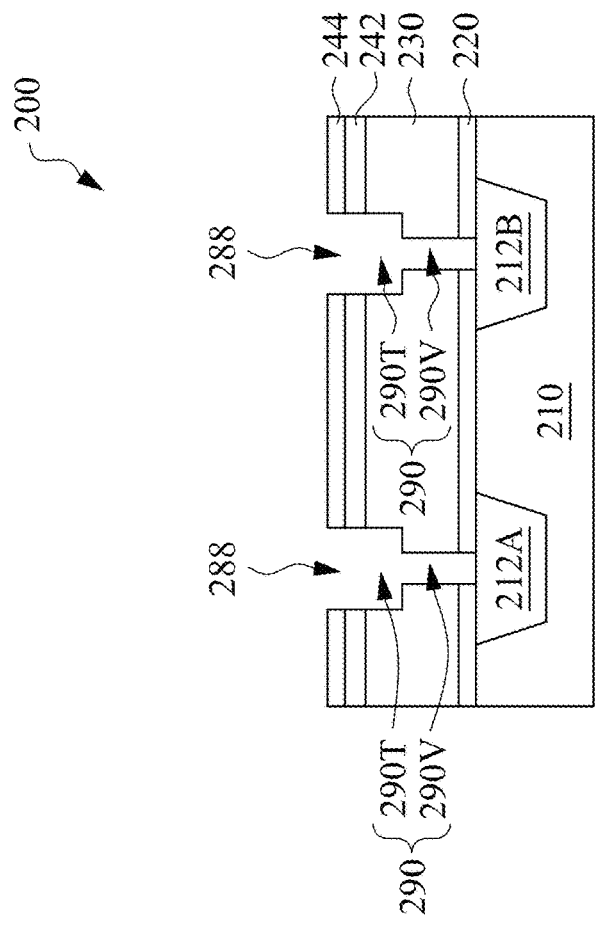

Referring to FIGS. 1 and 13, the method 100 proceeds to operation 124 in which interconnect openings 290 are formed extending through the ILD layer 230 and the etch stop layer 220, exposing portions of conductive structures 212A, 212B. The interconnect openings 290 each include a trench 290T and a via opening 290V, and are formed using a dual damascene process. In some embodiments, an etching process is performed to remove portions of an upper portion of the ILD layer 230 that are exposed by the trenches 288 to define trenches 290T in the upper portion of the ILD layer 230. In some embodiments, the etching process is anisotropic etch such as a RIE or a plasma etch. Next, a lithography and etching process is performed to define via openings 290V within corresponding trenches 290T. The via openings 290V extend through the ILD layer 230 and the etch stop layer 220, if present. The lithography process includes applying a photoresist layer (not shown) over the middle hard mask layer 244 to fill the trenches 290T and the trenches 288. The photoresist layer is then patterned by exposing the photoresist layer to a pattern of radiation and developing the photoresist layer to form a patterned photoresist layer (not shown). Once the patterned photoresist layer is formed, one or more anisotropic etching processes are performed to etch the ILD layer 230 and the etch stop layer 220 using the patterned photoresist layer as an etch mask forming the via openings 290V beneath corresponding trenches 290T. After formation of the via openings 290V, the patterned photoresist layer is removed, for example, by wet stripping or plasma ashing.

Figure 14:
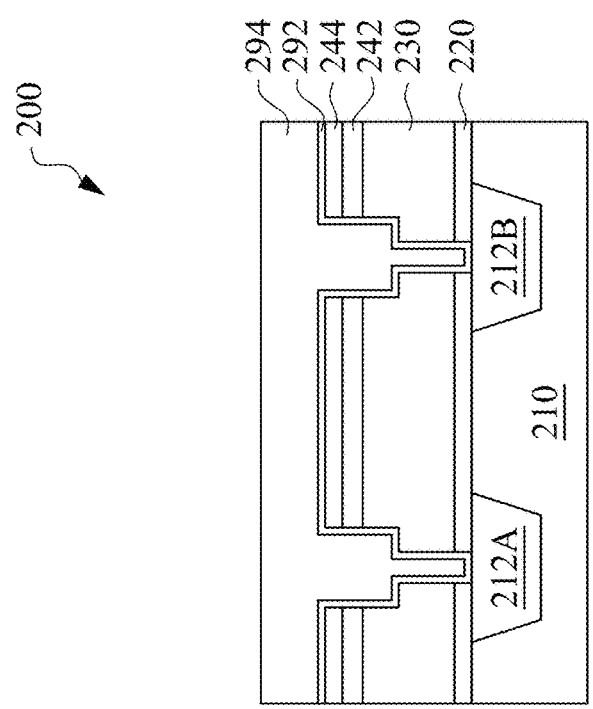

Referring to FIGS. 1 and 14, the method 100 proceeds to operation 126 in which a conductive liner layer 292 and a conductive material layer 294 are formed. The conductive liner layer 292 is deposited on sidewalls and bottoms of the interconnect openings 290, sidewalls of the trenches 288, and on the top surface of the ILD layer 230. In some embodiments, the conductive liner layer 292 includes a diffusion barrier material that prevents the metal in the conductive material layer 294 from diffusing into the ILD layer 230. In some embodiments, the conductive liner layer 292 includes Ti, TiN, Ta, TaN, Ru, RuN, or other suitable diffusion barrier materials. In some embodiments, the conductive liner layer 292 includes a stack of the above-mentioned diffusion barrier materials such as, for example, Ti/TiN or Ta/TaN. In some embodiments, the conductive liner layer 292 is deposited utilizing a conformal deposition process such as CVD, PECVD, PVD, or ALD.

Subsequently, the conductive material layer 294 is deposited over the conductive liner layer 292 to fill the interconnect openings 290 and the trenches 288. In some embodiments, the conductive material layer 294 includes Cu, Al, W, Co, an alloy thereof, or other suitable conductive metals. In some embodiments, the conductive material layer 294 is deposited by a suitable deposition process such as, for example, CVD, PECVD, sputtering, or plating. The deposition process is continued until the conductive material layer 294 fills the interconnect openings 290 and the trenches 288 and extends above the ILD layer 230. In some embodiments when Cu or a Cu alloy is employed in conductive material layer 294, an optional plating seed layer (not shown) is formed on the conductive liner layer 293 prior to the formation of the conductive material layer 294. In some embodiments, the optional plating seed layer is formed by a deposition process including, for example, CVD, PECVD, ALD, and PVD.

Referring to FIGS. 1 and 15, the method 100 proceeds to operation 128 in which interconnect structures 296A, 296B each include a conductive liner 292L and conductive material portion 294P are formed in the interconnect openings 290. In some embodiments, the interconnect structures include a first interconnect structure 296A contacting the first conductive structure 212A and a second interconnect structure 296B contacting the second conductive structure 212B. A portion of each interconnect structure 296A, 296B located in a corresponding trench 290T constitutes a metal line 296L, and another portion of each interconnect structure 296A, 296B located in a corresponding via opening 290V constitutes a via 296V.

The interconnect structures 296A, 296B are formed by removing portions of the conductive material layer 294 and the conductive liner layer 292 that are located above the top surface of the ILD layer 230 using a planarization process. In some embodiments, a CMP process is performed to remove the conductive material layer 294 and the conductive liner layer 292 from the top surface of the ILD layer 230. The CMP process also removes the remaining hard mask layer 240, e.g., the middle hard mask layer 244 and the bottom hard mask layer 242 from the top surface of the ILD layer 230. After the planarization, a portion of the conductive material layer 294 remaining in each of the interconnect openings 290 constitutes a conductive material portion 294P, a portion of the conductive liner layer 292 remaining in each of the interconnect openings 290 constitutes a conductive liner 292L. After the planarization process, top surfaces of the interconnect structures 296A, 296B are coplanar with the top surface of the ILD layer 230.

In some embodiments, the hydrogen plasma treatment helps to reduce LWR of the resist pattern before the pattern in the photoresist layer is transferred into the underlying ILD layer 230 through the hard mask layer 240. As a result, the trenches 290T formed in the ILD layer 230 that duplicate the profile of the resist pattern possess improved LWR. The improved LWR of trenches 290T in interconnect openings 290 helps to reduce the chance of electric shorts between the adjacent metal lines 296L subsequently formed therein. The hydrogen plasma treatment on the patterned photoresist layer thus helps to enlarge a bridge margin of metal lines, which leads to improve the device reliability. In some embodiments, a final opening for the metal line produced according to method 100 has a LER roughness ranging from about 3.3 nm to about 5.3 nm.

One aspect of this description relates to a method of forming a semiconductor device structure. The method includes forming a resist structure over a substrate. The resist structure includes an anti-reflective coating (ARC) layer and a photoresist layer over the ARC layer. The method further includes patterning the photoresist layer to form a trench therein. The method further includes performing a hydrogen plasma treatment to the patterned photoresist layer. The hydrogen plasma treatment is configured to smooth sidewalls of the trench without etching the ARC layer. The method further includes patterning the ARC layer using the patterned photoresist layer as a etch mask. In some embodiments, performing the hydrogen plasma treatment comprises using a process gas comprising a hydrogen gas and a carrier gas. In some embodiments, the carrier gas includes at least one inert gas selected from the group consisting of nitrogen, argon, and helium. In some embodiments, performing the hydrogen plasma treatment includes supplying the hydrogen gas at a flow rate ranging from about 20 standard cubic centimeters per minute (sccm) to about 500 sccm. In some embodiments, performing the hydrogen plasma treatment includes supplying the carrier gas at a flow rate ranging from about 10 sccm to about 300 sccm. In some embodiments, the process gas further includes fluoromethane ($CH_3F$), difluoromethane ($CH_2F_2$), or trifluoromethane ($CHF_3$). In some embodiments, forming the resist structure further includes forming an organic planarization layer (OPL), wherein the ARC layer is over the OPL; and patterning the OPL using the patterned photoresist layer as an etch mask. In some embodiments, the method further includes forming another resist structure over a substrate, the another resist structure comprising another anti-reflective coating (ARC) layer and another photoresist layer over the another ARC layer, patterning the another photoresist layer to form another trench therein, performing another hydrogen plasma treatment to the patterned another photoresist layer, wherein the another hydrogen plasma treatment is configured to smooth sidewalls of the another trench without etching the another ARC layer, and patterning the another ARC layer using the patterned another photoresist layer as a etch mask.

Another aspect of this description relates to a method of forming a semiconductor device structure. The method includes receiving a substrate. The method further includes forming an inter-layer dielectric (ILD) layer over the substrate. The method further includes forming a hard mask layer over the ILD layer. The method further includes forming a first resist structure over the substrate, the first resist structure comprising a first organic planarization layer (OPL), a first anti-reflective coating (ARC) layer over the first OPL and a first photoresist layer over the first ARC layer. The method further includes patterning the first photoresist layer to form a first pattern comprising a plurality of first trenches therein. The method further includes performing a first hydrogen plasma treatment to the patterned first photoresist layer. The first hydrogen plasma treatment is configured to smooth sidewalls of the plurality of first trenches without etching the first ARC layer. The method further includes transferring the first pattern into the first ARC layer and the first OPL. The method further includes transferring the first pattern into the hard mask layer to form a plurality of second trenches in the hard mask layer. The method further includes forming a second resist structure over the patterned hard mask layer and in the plurality of second trenches, the second resist structure comprising a second OPL, a second ARC layer over the second OPL and a second photoresist layer over the second ARC layer. The method further includes patterning the second photoresist layer to form a second pattern comprising a plurality of third trenches therein. The method further includes performing a second hydrogen plasma treatment to the patterned second photoresist layer, wherein the second hydrogen plasma treatment is configured to smooth sidewalls of the plurality of third trenches without etching the second ARC layer. The method further includes transferring the second pattern into the second ARC layer and the second OPL layer. The method further includes transferring the second pattern into the patterned hard mask layer to form a plurality of fourth trenches in the patterned hard mask layer. Each of the plurality of fourth trenches is disposed between two adjacent second trenches of the plurality of second trenches. The method further includes patterning the ILD layer using the patterned hard mask layer as an etch mask. In some embodiments, performing the first hydrogen plasma treatment and the performing the second hydrogen plasma treatment comprise using a process gas including a hydrogen gas and a carrier gas. In some embodiments, the carrier gas includes nitrogen, argon, helium, or a mixture thereof. In some embodiments, the first hydrogen plasma treatment and the second hydrogen plasma treatment are independently performed at a temperature ranging from about 200° C. to 600° C. In some embodiments, the first hydrogen plasma treatment and the second hydrogen plasma treatment are independently performed under a pressure ranging from about 5 millitorr (mT) to about 20 mT. In some embodiments, the first hydrogen plasma treatment and the second hydrogen plasma treatment are independently performed by a power ranging from about 400 W to about 1000 W. In some embodiments, a pitch between one second trench of the plurality of second trenches and an adjacent fourth trench of the plurality of fourth trenches is from about 30 nm to about 50 nm. In some embodiments, a line width roughness of the plurality of first trenches in the first photoresist layer after performing the first hydrogen plasma treatment is from 2 nm to 5 nm. In some embodiments, at least one processing parameter of processing parameters in performing the second hydrogen plasma treatment is different from processing parameters in performing the first hydrogen plasma treatment.

Still another aspect of this description relates to a method of forming a semiconductor device structure. The method includes receiving a substrate comprising a plurality of conductive structures. The method further includes forming an inter-layer dielectric (ILD) layer over the substrate. The method further includes forming a hard mask layer over the ILD layer. The method further includes forming a first resist structure over the substrate, the first resist structure including a first organic planarization layer (OPL), a first anti-reflective coating (ARC) layer over the first OPL and a first photoresist layer over the first ARC layer. The method further includes patterning the first photoresist layer to form a first pattern comprising a plurality of first trenches therein. The method further includes performing a first hydrogen plasma treatment to the patterned first photoresist layer. The first hydrogen plasma treatment is configured to improve a line width roughness (LWR) of the patterned first photoresist layer without etching the first ARC layer. The method further includes transferring the first pattern into the first ARC layer and the first OPL. The method further includes transferring the first pattern into the hard mask layer to form a plurality of second trenches in the hard mask layer. The method further includes forming a second resist structure over the patterned hard mask layer and in the plurality of the second trenches, the second resist structure including a second OPL, a second ARC layer over the second OPL and a second photoresist layer over the second ARC layer. The method further includes patterning the second photoresist layer to form a second pattern comprising a plurality of third trenches therein. The method further includes performing a second hydrogen plasma treatment to the patterned second photoresist layer. The second hydrogen plasma treatment is configured to improve a line width roughness of the patterned second photoresist layer without etching the second ARC layer. The method further includes transferring the second pattern into the second ARC layer and the second OPL layer. The method further includes transferring the second pattern into the patterned hard mask layer to form a plurality of fourth trenches in the patterned hard mask layer. Each of the plurality of fourth trenches is disposed between two adjacent second trenches of the plurality of second trenches. The method further includes patterning the ILD layer using the patterned hard mask layer as an etch mask to form a plurality of interconnect openings therein. The method further includes forming a plurality of interconnect structures in the plurality of interconnect openings. The plurality of interconnect structures contact the plurality of conductive structures. In some embodiments, performing the first hydrogen plasma treatment and performing the second hydrogen plasma treatment comprise using a process gas comprising a hydrogen gas and a carrier gas. In some embodiments, forming the hard mask layer comprises forming a bottom hard mask layer over the ILD layer, forming a middle hard mask layer over the bottom hard mask layer, and forming a top hard mask layer over the middle hard mask layer. The plurality of second trenches and the plurality of fourth trenches are formed in the top hard mask layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device structure, comprising:
    receiving a substrate;
    forming an inter-layer dielectric (ILD) layer over the substrate;
    forming a hard mask layer over the ILD layer;
    forming a first resist structure over the substrate, the first resist structure comprising a first organic planarization layer (OPL), a first anti-reflective coating (ARC) layer over the first OPL and a first photoresist layer over the first ARC layer;
    patterning the first photoresist layer to form a first pattern comprising a plurality of first trenches therein;
    performing a first hydrogen plasma treatment to the patterned first photoresist layer, wherein the first hydrogen plasma treatment is configured to smooth sidewalls of the plurality of first trenches;
    transferring the first pattern into the first ARC layer and the first OPL;
    transferring the first pattern into the hard mask layer to form a plurality of second trenches in the hard mask layer;
    forming a second resist structure over the patterned hard mask layer and in the plurality of second trenches, the second resist structure comprising a second OPL, a second ARC layer over the second OPL and a second photoresist layer over the second ARC layer;
    patterning the second photoresist layer to form a second pattern comprising a plurality of third trenches therein;
    performing a second hydrogen plasma treatment to the patterned second photoresist layer, wherein the second hydrogen plasma treatment is configured to smooth sidewalls of the plurality of third trenches;
    transferring the second pattern into the second ARC layer and the second OPL layer;
    transferring the second pattern into the patterned hard mask layer to form a plurality of fourth trenches in the patterned hard mask layer, wherein each of the plurality of fourth trenches is disposed between two adjacent second trenches of the plurality of second trenches; and
    patterning the ILD layer using the patterned hard mask layer as an etch mask.

2. The method of claim 1, wherein performing the first hydrogen plasma treatment and the performing the second hydrogen plasma treatment comprise using a process gas comprising a hydrogen gas and a carrier gas.

3. The method of claim 2, wherein the carrier gas comprises nitrogen, argon, helium, or a mixture thereof.

4. The method of claim 1, wherein the first hydrogen plasma treatment and the second hydrogen plasma treatment are independently performed at a temperature ranging from about 200° C. to 600° C.

5. The method of claim 1, wherein the first hydrogen plasma treatment and the the second hydrogen plasma treatment are independently performed under a pressure ranging from about 5 millitorr (mT) to about 20 mT.

6. The method of claim 1, wherein the first hydrogen plasma treatment and the second hydrogen plasma treatment are independently performed by a power ranging from about 400 W to about 1000 W.

7. The method of claim 1, wherein a pitch between one second trench of the plurality of second trenches and an adjacent fourth trench of the plurality of fourth trenches is from about 30 nm to about 50 nm.

8. The method of claim 1, wherein a line width roughness of the plurality of first trenches in the first photoresist layer after performing the first hydrogen plasma treatment is from 2 nm to 5 nm.

9. The method of claim 1, wherein at least one processing parameter of processing parameters in performing the second hydrogen plasma treatment is different from processing parameters in performing the first hydrogen plasma treatment.

10. A method of forming a semiconductor device structure, comprising:
- receiving a substrate comprising a plurality of conductive structures;
- forming an inter-layer dielectric (ILD) layer over the substrate;
- forming a hard mask layer over the ILD layer;
- forming a first resist structure over the substrate, the first resist structure comprising a first organic planarization layer (OPL), a first anti-reflective coating (ARC) layer over the first OPL and a first photoresist layer over the first ARC layer;
- patterning the first photoresist layer to form a first pattern comprising a plurality of first trenches therein;
- performing a first hydrogen plasma treatment to the patterned first photoresist layer, wherein the first hydrogen plasma treatment is configured to improve a line width roughness (LWR) of the patterned first photoresist layer;
- transferring the first pattern into the first ARC layer and the first OPL;
- transferring the first pattern into the hard mask layer to form a plurality of second trenches in the hard mask layer;
- forming a second resist structure over the patterned hard mask layer and in the plurality of the second trenches, the second resist structure comprising a second OPL, a second ARC layer over the second OPL and a second photoresist layer over the second ARC layer;
- patterning the second photoresist layer to form a second pattern comprising a plurality of third trenches therein;
- performing a second hydrogen plasma treatment to the patterned second photoresist layer, wherein the second hydrogen plasma treatment is configured to improve a line width roughness of the patterned second photoresist layer;
- transferring the second pattern into the second ARC layer and the second OPL layer;
- transferring the second pattern into the patterned hard mask layer to form a plurality of fourth trenches in the patterned hard mask layer, wherein each of the plurality of fourth trenches is disposed between two adjacent second trenches of the plurality of second trenches;
- patterning the ILD layer using the patterned hard mask layer as an etch mask to form a plurality of interconnect openings therein; and
- forming a plurality of interconnect structures in the plurality of interconnect openings, wherein the plurality of interconnect structures contact the plurality of conductive structures.

11. The method of claim 10, wherein performing the first hydrogen plasma treatment and performing the second hydrogen plasma treatment comprise using a process gas comprising a hydrogen gas and a carrier gas.

12. The method of claim 10, wherein forming the hard mask layer comprises:
- forming a bottom hard mask layer over the ILD layer;
- forming a middle hard mask layer over the bottom hard mask layer; and
- forming a top hard mask layer over the middle hard mask layer, wherein the plurality of second trenches and the plurality of fourth trenches are formed in the top hard mask layer.

* * * * *